(12) United States Patent
Pera et al.

(10) Patent No.: US 7,420,428 B2
(45) Date of Patent: Sep. 2, 2008

(54) LOW NOISE PHASE LOCKED LOOP WITH A HIGH PRECISION LOCK DETECTOR

(75) Inventors: Florin Pera, Kanata (CA); Dennis Whittaker, Tampa, FL (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 99 days.

(21) Appl. No.: 11/485,664

(22) Filed: Jul. 13, 2006

(65) Prior Publication Data
US 2008/0024230 A1   Jan. 31, 2008

(51) Int. Cl.
*H03L 7/00*   (2006.01)
(52) U.S. Cl. .......................................... 331/17; 331/16
(58) Field of Classification Search .................. 331/11, 331/16, 17
See application file for complete search history.

(56) References Cited
U.S. PATENT DOCUMENTS
4,542,351 A   9/1985   Okada 6,803,827 B1 *  10/2004  Kenney et al. ................ 331/16
6,856,202 B2   2/2005  Lesso

FOREIGN PATENT DOCUMENTS
EP   0 278 079 A2   8/1988

* cited by examiner

*Primary Examiner*—Joseph Chang
(74) *Attorney, Agent, or Firm*—RatnerPrestia (57) ABSTRACT

A phase lock loop (PLL) includes a voltage controlled oscillator (VCO) for providing a VCO output signal. A first phase/frequency detector (PFD) for providing a first voltage tuning signal is included for controlling a frequency of the VCO output signal by comparing a first reference signal to the VCO output signal. A second phase/frequency detector (PFD) for providing a second voltage tuning signal is included for controlling the frequency of the VCO output signal by comparing a second reference signal to the VCO output signal. The first and second voltage tuning signals provide, respectively, first and second gains of frequency per volt for controlling the frequency of the VCO output signal. The first voltage tuning signal has a higher gain than the second voltage tuning signal. The first voltage tuning signal provides coarse frequency control of the VCO output signal and the second voltage tuning signal provides fine frequency control of the VCO output signal.

22 Claims, 8 Drawing Sheets

FIG. 4A f2
FIG. 4B f1
FIG. 4C UPB
FIG. 4D DN
FIG. 4E XNOR OUT
FIG. 4F VREF, LPF OUT
FIG. 4G f3

FIG. 9A  XNOR OUT
FIG. 9B  UPB
FIG. 9C  DN

FIG. 10A  XNOR OUT
FIG. 10B  UPB
FIG. 10C  DN

LOW NOISE PHASE LOCKED LOOP WITH A HIGH PRECISION LOCK DETECTOR

FIELD OF THE INVENTION

The present invention relates, in general, to phase locked loop (PLL) systems. More specifically, the present invention relates to a low noise PLL with a high precision lock detector.

BACKGROUND OF THE INVENTION

A phase locked loop (PLL) is a frequency feedback circuit that is used to lock a locally generated clock signal to an external reference signal. A PLL is useful in telecommunications equipment and audio/visual equipment that receive a reference signal and require a local clock signal, whose frequency and phase are related (locked) to the received signal, in order to properly decode incoming signals.

In general, a PLL includes a reference frequency generator, a phase and frequency detector (PFD), a charge pump and a voltage controlled oscillator (VCO). The PFD detects the frequency and phase difference between the VCO output frequency (as a feedback signal) and the reference frequency. The PFD outputs a control signal to the charge pump to produce a voltage that is proportional to the frequency and phase difference.

Conventional PLL systems are notoriously noisy during their acquisition and tracking cycles because of the desire to adjust and correct quickly the frequency of the VCO output signal. Hence, there is a need for an improved PLL system that quickly adjusts its frequency output but produces little noise in the process. Additionally, there is a need to accurately determine when the PLL frequency is within a small error range that may be expressed in minute quantities of parts per million (PPM). The present invention addresses such a PLL system.

SUMMARY OF THE INVENTION

To meet this and other needs, and in view of its purposes, the present invention provides a phase lock loop (PLL) including a voltage controlled oscillator (VCO) for providing a VCO output signal. A first phase/frequency detector (PFD) is included for providing a first voltage tuning signal for controlling a frequency of the VCO output signal by comparing a first reference signal to the VCO output signal; and a second phase/frequency detector (PFD) is included for providing a second voltage tuning signal for controlling the frequency of the VCO output signal by comparing a second reference signal to the VCO output signal. The first and second voltage tuning signals provide, respectively, first and second gains of frequency per volt for controlling the frequency of the VCO output signal.

The first voltage tuning signal may have a higher gain than the second voltage tuning signal. In addition, the first voltage tuning signal provides coarse frequency control of the VCO output signal and the second voltage tuning signal provides fine frequency control of the VCO output signal.

A filter network is coupled between the first and second PFDs and the VCO for filtering the first and second voltage tuning signals prior to controlling the frequency of the VCO output signal. The filter network includes resistive and capacitive elements for damping or reducing overshoot of the second voltage tuning signal.

A first charge pump is coupled between the first PFD and the VCO for providing the first voltage tuning signal, and a second charge pump is coupled between the second PFD and the VCO for providing the second voltage tuning signal. Also included is an enable/disable signal for enabling one of the first and second charge pumps or disabling the other one of the first and second charge pumps.

A frequency divider is coupled to the VCO output signal. The frequency divider provides a first feedback signal to the first PFD for comparison with the first reference signal. A second feedback signal may be provided directly from the VCO output signal to the second PFD for comparison with the second reference signal. The first reference signal has a lower frequency than the second reference signal, and the second reference signal is substantially equal to a desired frequency of the VCO output signal.

Another embodiment of the present invention is a phase lock loop (PLL) that includes a voltage controlled oscillator (VCO) for providing a VCO output signal; a phase/frequency detector (PFD) for receiving (a) the VCO output signal and (b) a reference signal, and outputting up/down pulses; an exclusive-or (XOR) gate for logically combining the up/down pulses and outputting an XOR signal; an integrator coupled to the XOR gate for outputting an integrated XOR signal; and a comparator for comparing the integrated XOR signal to a predetermined threshold level and providing a comparator output signal having a time period dependent upon the integrated XOR signal. When the time period of the comparator output signal exceeds a predetermined threshold time period, the VCO is providing a desired frequency for the VCO output signal.

The PLL includes an edge detector coupled to the comparator for detecting rising edges of the comparator output signal; and a counter coupled to the edge detector for counting a time period between detected rising edges to determine the time period of the comparator output signal. The counter determines the time period, T, based on the following relationship:

$$T = 1/(\text{reference frequency} - VCO \text{ feedback frequency})$$

where the reference frequency is the frequency of the reference signal, and the VCO feedback frequency is the frequency of the VCO output signal. When T exceeds the predetermined threshold time period, the VCO is providing the desired frequency for the VCO output signal.

The PLL also includes a charge pump coupled between the PFD and the VCO for providing a first voltage tuning signal to control the frequency of the VCO output signal. Another charge pump is coupled between another PFD and the VCO for providing a second voltage tuning signal to control the frequency of the VCO output signal. The second voltage tuning signal has a gain of frequency per volt that is lower than a gain of frequency per volt of the first voltage tuning signal.

Yet another embodiment of the present invention is a method of controlling a frequency of a voltage controlled oscillator (VCO) having an acquisition mode and a tracking mode. The method includes the steps of: (a) tuning the frequency of the VCO using a first phase/frequency detector (PFD); (b) tuning the frequency of the VCO using a second phase/frequency detector (PFD); (c) enabling the first PFD and disabling the second PFD during the acquisition mode; and (d) enabling the second PFD and disabling the first PFD during the tracking mode.

It is understood that the foregoing general description and the following detailed description are exemplary, but not restrictive, of the invention.

BRIEF DESCRIPTION OF THE DRAWING

The invention is best understood from the following detailed description when read in connection with the accompanying drawing. Included in the drawing are the following figures.

DETAILED DESCRIPTION OF THE INVENTION

As will be described, the present invention provides a low noise phase locked loop (PLL) with a high precision lock detector. The PLL includes a voltage controlled oscillator (VCO) that is tuned by two separate tuning signals. The first tuning signal controls the VCO during its acquisition mode and the second tuning signal controls the VCO during its tracking mode. A first phase/frequency detector (PFD) operating a charge pump establishes the first tuning signal. A second phase/frequency detector (PFD) operating a second charge pump establishes the second tuning signal. The first charge pump is enabled during the acquisition mode of the VCO and the second charge pump is enabled during the tracking mode of the VCO. When one charge pump is enabled, however, the other charge pump is disabled.

The first tuning signal has a large gain that, for example, is greater than 1 GHz per volt, while the second tuning signal has a lower gain that, for example, is less than 1 GHz per volt. More typically, the second tuning signal has a gain that is less than three times that of the first tuning signal. Such gain, for example, may be 300 MHz per volt. The inventor has discovered that the high gain quickly allows the PLL to acquire the desired frequency, while the lower gain allows the PLL to operate with low noise interference.

The first PFD and charge pump operate by comparing (1) a first reference frequency signal from an external source, such as a clock reference, and (2) a first feedback frequency signal from the VCO. As will be explained, the first feedback frequency signal to the first PFD is provided by way of a frequency divider, which lowers the VCO feedback frequency to 150 MHz, for example. The first reference frequency, in such case, is also set to be approximately the same as the first feedback frequency provided by the frequency divider (for example, 150 MHz).

The second PFD and charge pump operate by comparing (1) a second reference frequency signal from an external source, such as a clock reference, and (2) a second feedback frequency signal from the VCO. As will be explained, the second reference frequency is substantially equal to the desired frequency of the VCO. Such desired frequency may be, for example, 10 GHz. The second feedback frequency signal may be a direct feedback signal from the VCO. In this example, the frequency of the signal may be approximately equal to 10 GHz.

Also included in the present invention is an RC filter network that filters the first and second tuning signals to further lower the noise of the VCO output signal. The filter network, described in detail later, provides a high damping response and reduces overshoot response of the first and second tuning signals.

A further aspect of the present invention includes a high precision lock detector to ascertain whether the PLL is locked onto the desired frequency. The high precision lock detector generates a lock detect signal to indicate the PLL lock status. This and other features, as explained below, contribute to advantageous improvements over conventional phase locked loops.

Figure 1:
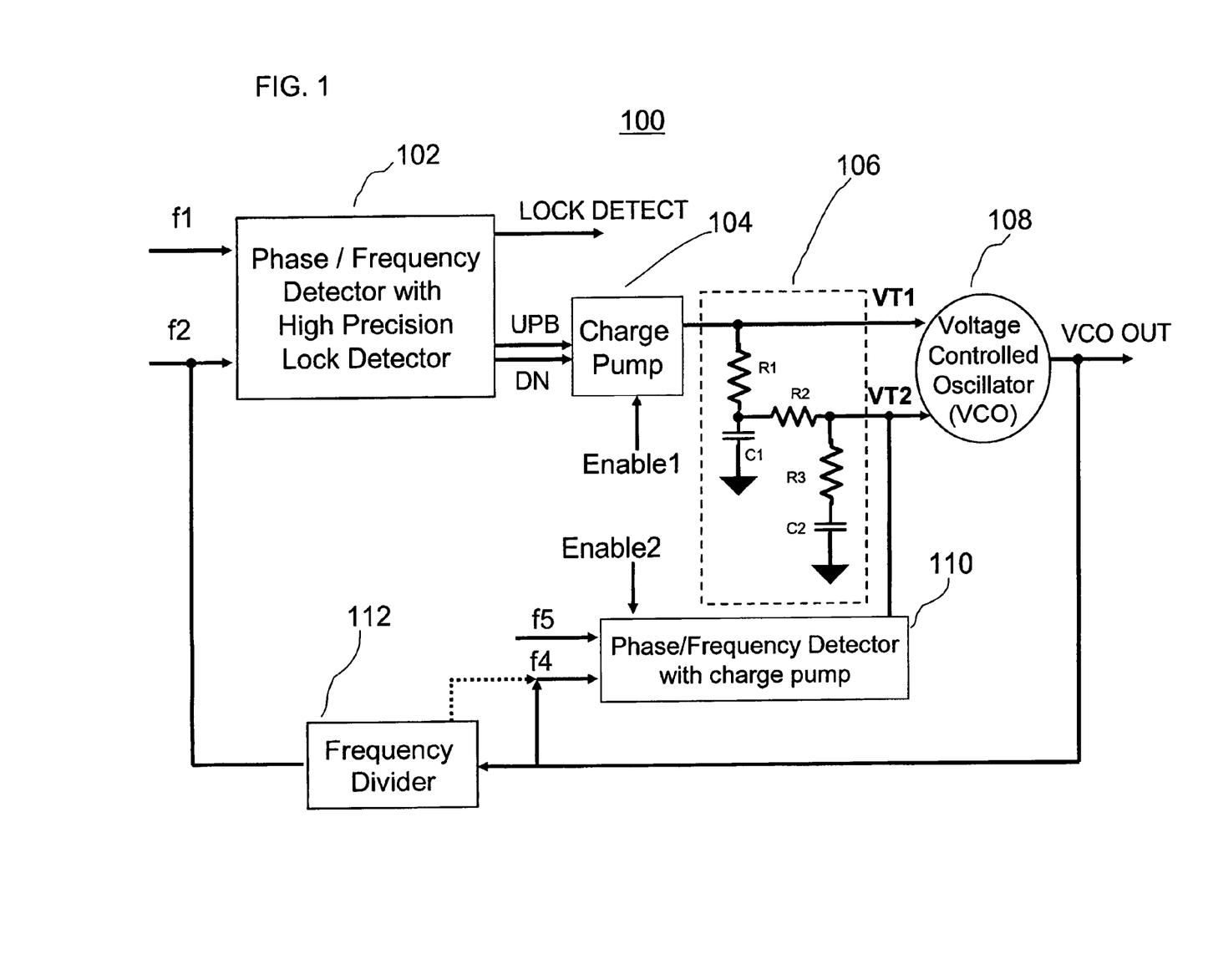
FIG. 1 is a functional block diagram of a low noise phase locked loop with a high precision lock detector, in accordance with an embodiment of the present invention.

Referring first to FIG. 1, there is shown a functional block diagram of a phase locked loop (PLL) system including a high precision lock detector, the system generally referred to as 100. As shown, PLL system 100 includes Phase/Frequency Detector (PFD) with High Precision Lock Detector 102. The PFD with High Precision Lock Detector 102 receives a reference frequency f1 signal and a feedback frequency f2 signal. Reference frequency f1 signal may be generated externally by an oscillator, such as a quartz crystal (not shown). The reference frequency is generally a lower frequency multiple of the desired lock frequency. The feedback frequency f2 signal is the VCO output feedback frequency, which is first divided down by frequency divider 112.

As shown, PLL system 100 further includes charge pump 104 that receives up/down pulses from PFD with High Precision Lock Detector 102. Charge Pump 104 provides an analog voltage, designated as voltage tuning one, or VT1, to RC filter network 106. The VT1 signal controls the frequency output of VCO 108. Charge pump 104 also receives an Enable1 signal for enabling or disabling the charge pump. This signal is described in more detail below.

The PLL system 100 also includes a second phase/frequency detector (PFD) with a charge pump, shown as 110. The PFD with charge pump 110 (abbreviated herein as PFDCP 110) provides an analog voltage, designated as voltage tuning two, or VT2, to RC filter network 106. The VT2 signal controls the frequency output of VCO 108. The PFDCP 110 receives an Enable 2 signal for enabling or disabling the charge pump of PFDCP 110. The Enable 2 signal is described in more detail below.

The VCO 108 provides as an output the VCO OUT signal, typically at a high frequency (for example 10 GHz). This high frequency may or may not be the desired frequency. The VCO OUT signal is looped back as a feedback signal to frequency divider 112 and to PFDCP 110. Frequency divider 112 divides the VCO OUT frequency by an integer multiple (for example, divide by 64) and provides the divided VCO OUT signal as the feedback frequency f2 signal (for example 150 MHz). On the other hand, PFDCP 110 receives the VCO OUT signal directly from VCO 108 and the frequency divider is bypassed. The frequency of the VCO OUT signal may be, for example, 10 GHz.

The PFDCP 110 also receives a reference frequency f5 signal, which is the desired high frequency VCO output signal that PLL system 100 is attempting to lock onto. In this example, the reference frequency f5 signal may be 10 GHz.

The reference frequency f4 signal may be the VCO OUT signal directly connected to PFDCP 110 or, alternatively, the f4 signal may be derived from the VCO OUT signal through frequency divider 112. Frequency divider 112 may divide the VCO OUT frequency by an integer multiple (for example, divide by 2) and provide the divided VCO OUT signal as the feedback frequency f4 signal (for example 5 GHz). On the other hand, PFDCP 110 may receive the VCO OUT signal directly from VCO 108. The frequency of the VCO OUT signal may be, for example, 10 GHz.

The RC filter network 106 includes R1 and C1 connected in series to each other and in parallel to the terminal providing the VT1 tuning signal. Similarly, RC filter network 106 includes R3 and C2 connected in series to each other and in parallel to the terminal providing the VT2 tuning signal. A resistor R2 couples the output of the VT1 signal together with the output of the VT2 signal. In operation, although charge pump 104 may be in a disabled mode, nevertheless the VT1 signal is still present, and effectively supplies a DC bias about which the VT2 signal primarily controls the VCO frequency. In a similar manner, although PFDCP 110 may be in a disabled mode, nevertheless the VT2 signal is still present, but effectively provides minor affect on controlling the VCO frequency, because primary control is provided by way of the VT1 signal.

Thus, one of the advantages of the present invention is that the VT1 signal and the VT2 signal are combined by way of RC filter network 106 and both tuning signals simultaneously control the frequency of the VCO output signal. The amount of control, however, varies depending on whether one charge pump is enabled or the other charge pump is enabled. As described previously, only one charge pump at any one time is enabled, while the other charge pump is disabled. Because both VT1 and VT2 remain in the direct path of tuning the VCO, this effectively reduces noise in the system, although the system switches from one charge pump to the other charge pump.

Figure 2:
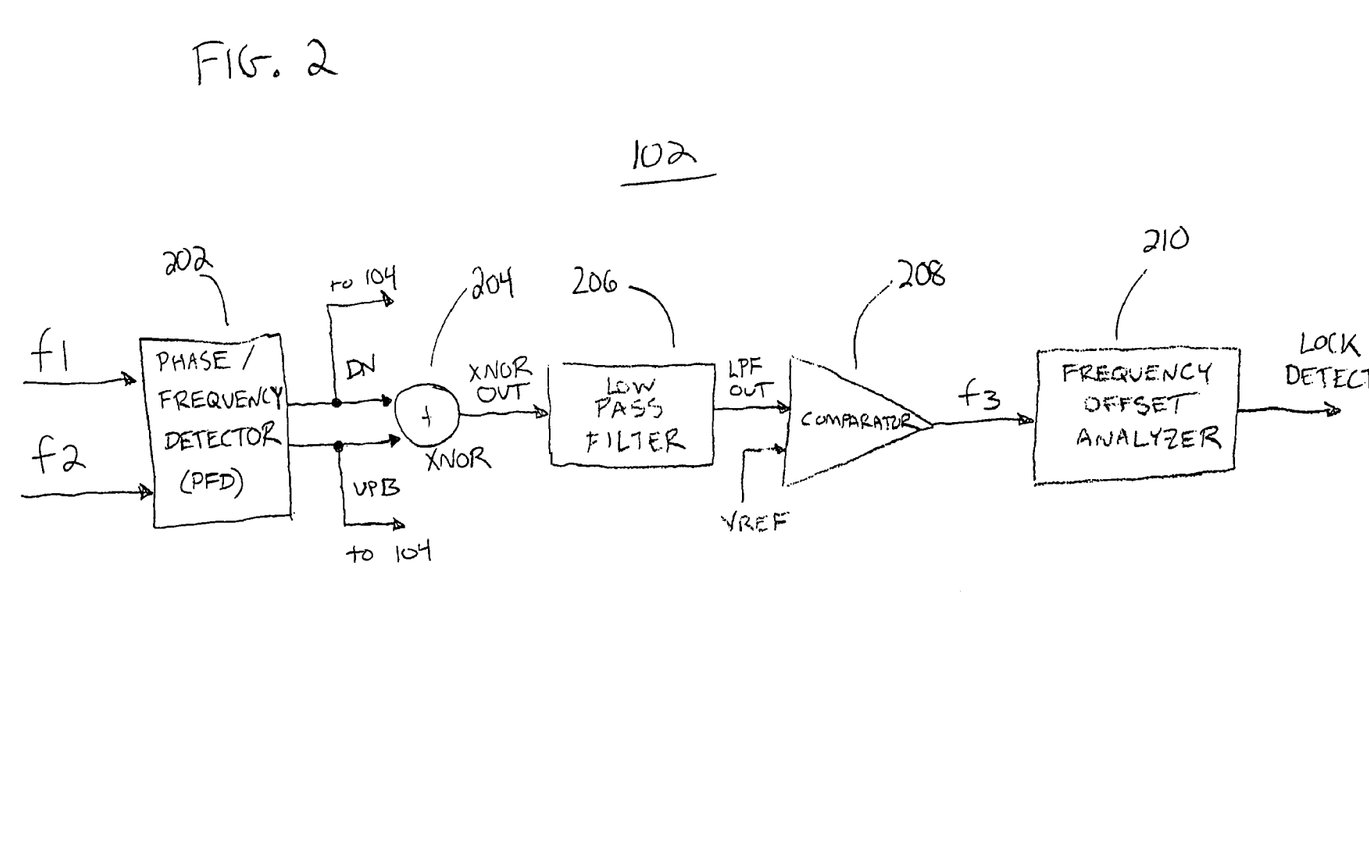
FIG. 2 is a functional block diagram of the phase/frequency detector with the high precision lock detection shown in FIG. 1, in accordance with an embodiment of the present invention.

A functional block diagram of PFD with High Precision Lock Detector 102 is shown in FIG. 2. As shown, PFD with High Precision Lock Detector 102 includes Phase/Frequency detector (PFD) 202, which receives the signals having the reference and feedback frequencies f1 and f2, respectively. The PFD 202 receives the reference frequency f1 signal and the feedback frequency f2 signal and generates, in a conventional manner, output pulses labeled as down (DN) and up bar (UPB), which are used to control Charge Pump 104 shown in FIG. 1. Signals DN and UPB are, at the same time, provided to a logic gate, exclusive-NOR gate 204 (XNOR 204). The XNOR provides the XNOR OUT signal, as shown. Although shown as an XNOR logic gate, it will be appreciated that the PLL system is equally effective when providing an exclusive-OR (XOR) gate, instead of an XNOR gate.

The XNOR OUT signal is integrated by low pass filter (LPF) 206, which generates an LPF OUT signal. LPF OUT signal is compared to a predetermined reference threshold voltage, VREF, by comparator 208. Comparator 208 generates output signal f3, which is provided to frequency offset analyzer 210. Frequency offset analyzer 210 generates the LOCK DETECT signal, which is also shown in FIG. 1 as the LOCK DETECT signal outputted from PFD with High Precision Lock Detector 102.

Figure 3:
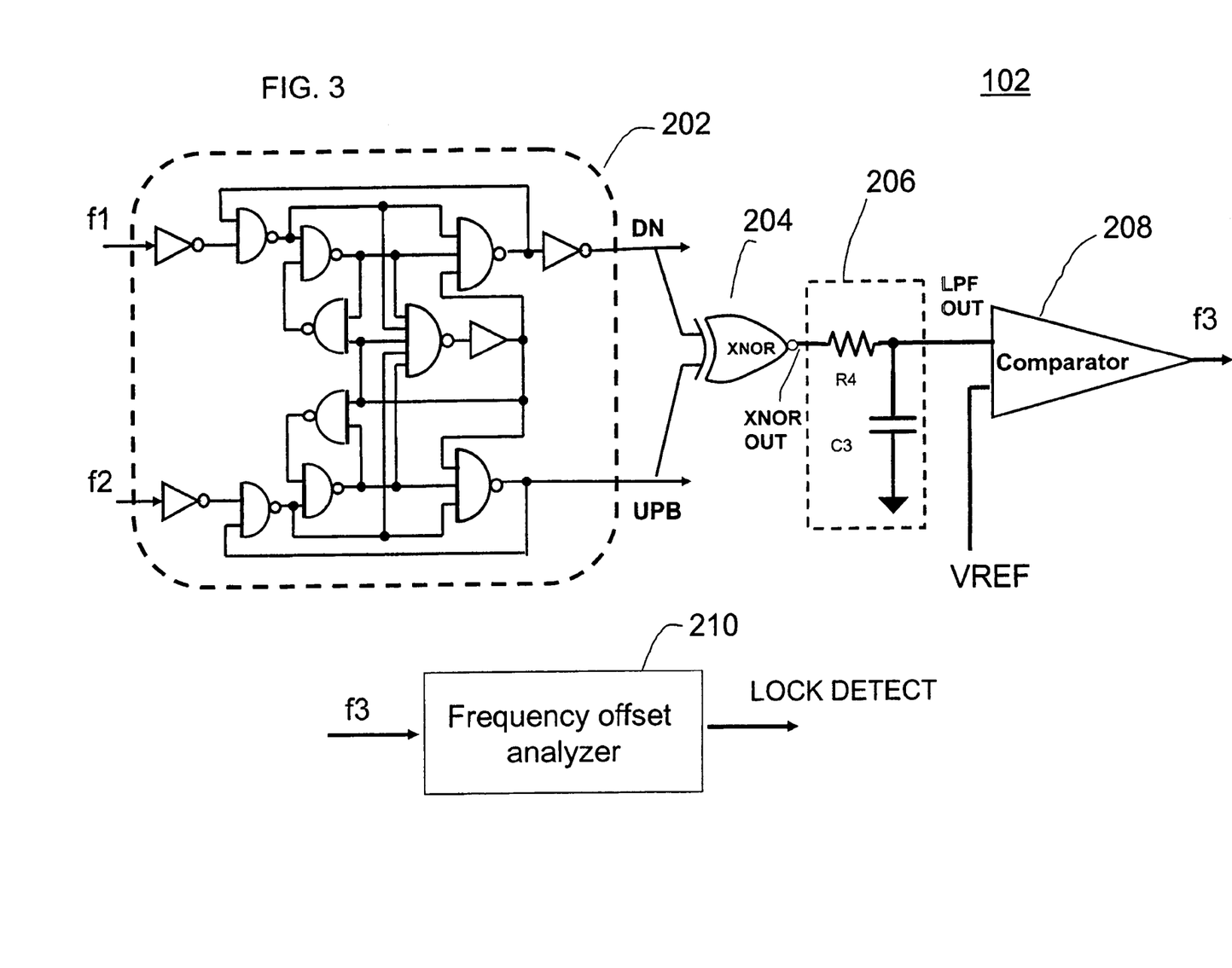
FIG. 3 is schematic diagram of the phase/frequency detector with the high precision lock detection shown in FIG. 2, in accordance with an embodiment of the present invention.

Referring next to FIG. 3, there is shown an exemplary embodiment of the PFD with High Precision Lock Detector that has just been described with reference to FIG. 2. In the embodiment shown in FIG. 3, the logic gates of a conventional phase/frequency detector are shown as PFD 202. This PFD is known as a zero dead zone PFD for generating up (actually up bar) and down pulses. The PFD 202 is followed by XNOR gate 204 and low pass filter (LPF) 206, the latter being implemented, as an example, by resistor R4 and capacitor C3. The output from the LPF is inputted into comparator 208 for comparison with the VREF signal. The output signal from comparator 208, shown as the f3 signal, is provided to Frequency Offset Analyzer 210.

In operation, when VCO feedback frequency f2 and reference frequency f1 are substantially equal to each other, output pulse DN is generally low and output pulse UPB is generally high; each of these pulses is seen as a transient toggle pulse. As VCO feedback frequency f2 begins to lag reference frequency f1, output pulse DN remains generally low, and the duration of time that output pulse UPB is low increases proportionally to the increase in the lag time. Conversely, as VCO feedback frequency f2 begins to lead reference frequency f1, output pulse UPB remains generally high, and the duration of time that output pulse DN is high increases proportionally to the increase in the lead time. Thus, output pulses UPB and DN are proportional to the frequency and phase difference between the two f1 and f2 input signals.

This proportionality of the output pulses UPB and DN to the phase and frequency of input signals f1 and f2 is utilized to control the output frequency of the VCO. Output pulses UPB and DN are connected to charge pump 104 which increases or decreases the VCO control voltage based on output pulses UPB and DN. As the pulse durations of output pulse UPB become increasingly, as a function of time, to be in a low state, charge pump 104 increases the VCO control voltage; and as the pulse duration of output pulse DN become increasingly, as a function of time, to be in a high state, charge pump 104 decreases the VCO control voltage.

As shown in FIG. 3, output pulses UPB and DN are inputted into exclusive-NOR gate 204. Because output pulse UPB is proportional to the phase and frequency lag of f2 to f1, and output pulse DN is proportional to the phase and frequency lead of f2 to f1, the output of the exclusive-NOR is also proportional to the phase and frequency difference between f1 and f2.

The XNOR OUT signal is integrated by low pass filter 206, forming a low pass average analog voltage level at LPF OUT. The LPF OUT is then compared to a predetermined reference voltage threshold, VREF, by comparator 208. The VREF threshold is determined based on the UPB and DN pulse amplitudes and the low pass filter characteristics. When the voltage of LPF OUT exceeds VREF, comparator 208 toggles its output to provide the f3 signal. The f3 signal becomes a level one when the voltage of LPF OUT exceeds VREF and a level zero when the voltage of LPF OUT is lower than VREF. The frequency of f3 is proportional to the difference between the reference frequency f1 and the VCO feedback frequency f2, according to the equation $f3=f1-f2$. FIGS. 4A-G show exemplary relationships among these signals.

Figure 4A:
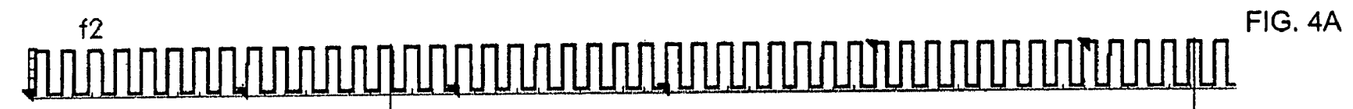
FIGS. 4A, 4B, 4C, 4D, 4E, 4F and 4G are timing diagrams showing exemplary relationships among the signals flowing in the modules shown in FIG. 2.
Figure 4B:
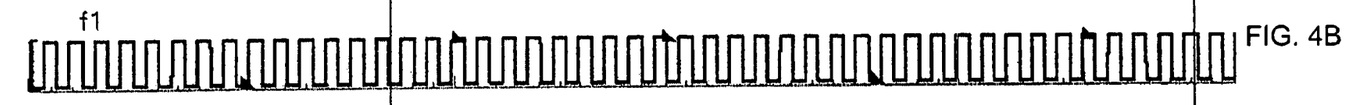
Figure 4C:
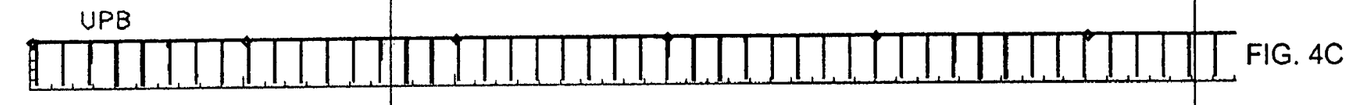
Figure 4D:
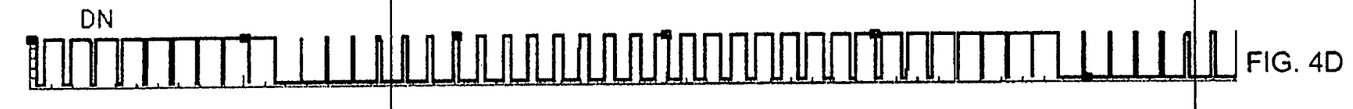
Figure 4E:
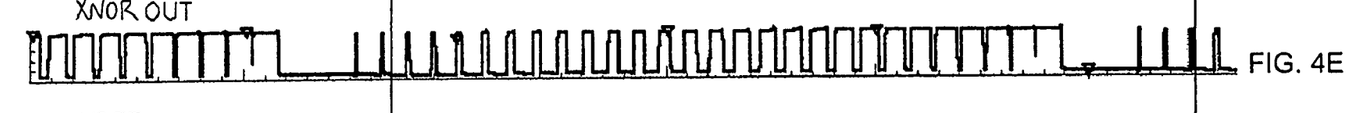
Figure 4F:
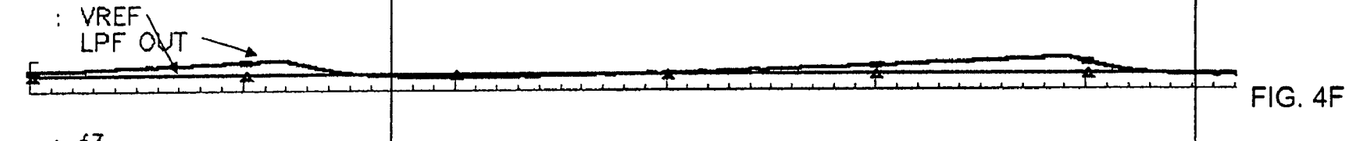
Figure 4G:
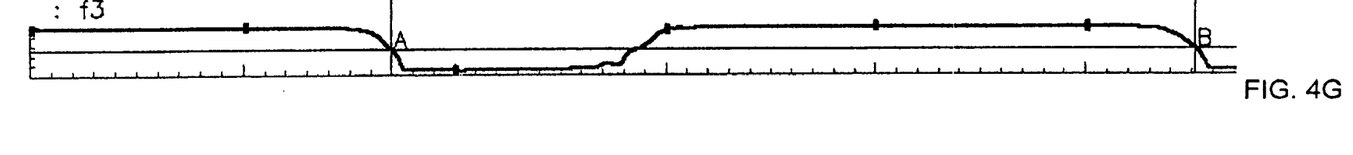

As shown, the f1 and f2 signals are depicted in FIGS. 4A and 4B. The output pulses UPB and DN are depicted, respectively, in FIGS. 4C and 4D. The XNOR OUT signal is shown in FIG. 4E. The integrated output of LPF OUT is shown against the VREF threshold in FIG. 4F, and the f3 output signal of comparator 208 is shown in FIG. 4G.

Figure 5:
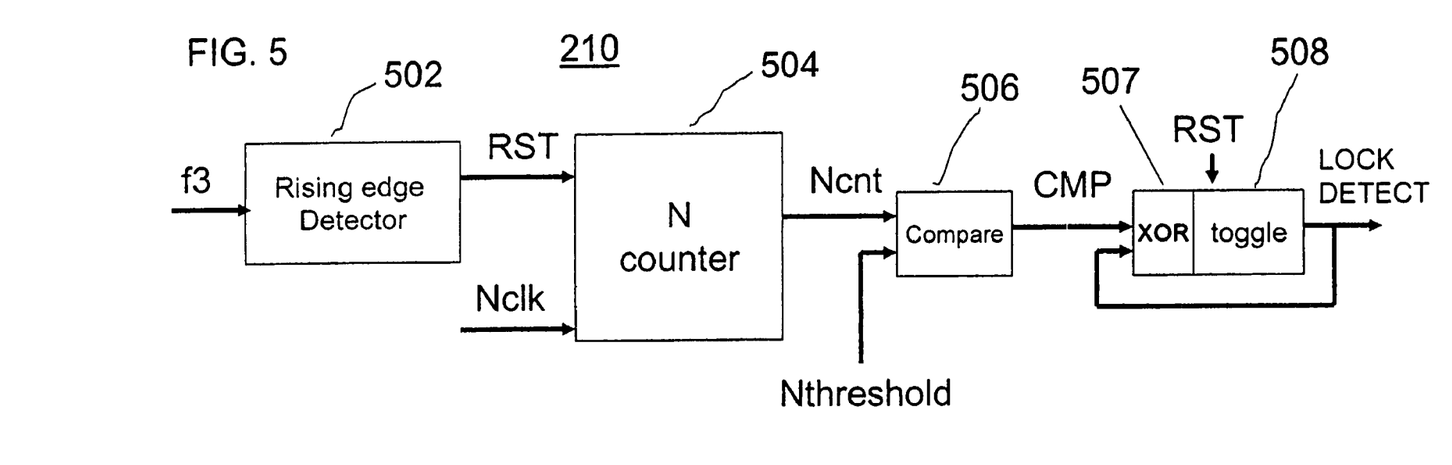
FIG. 5 is a functional block diagram of a frequency offset analyzer shown in FIG. 2, in accordance with an embodiment of the present invention.
Figure 6A:
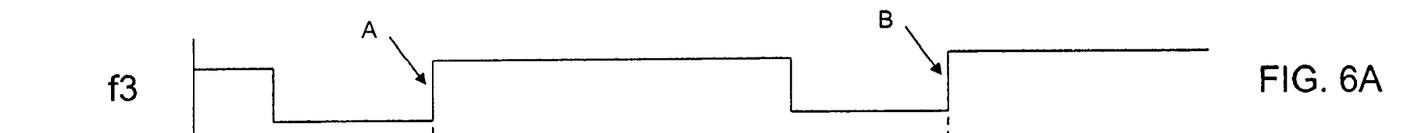
FIGS. 6A and 6B are timing diagrams showing an exemplary relationship between signals in the frequency offset analyzer shown in FIG. 5, in accordance with an embodiment of the present invention.
Figure 6B:
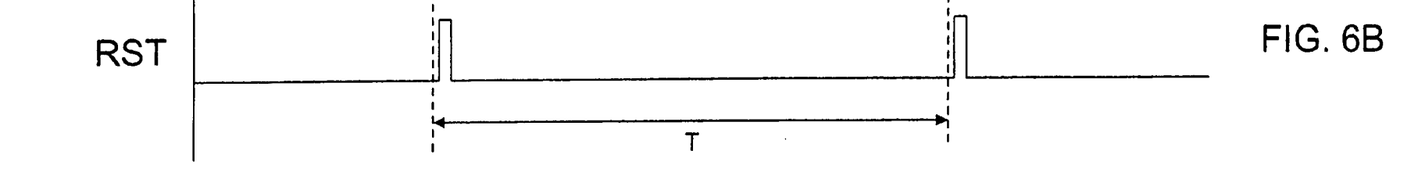
Figure 7A:
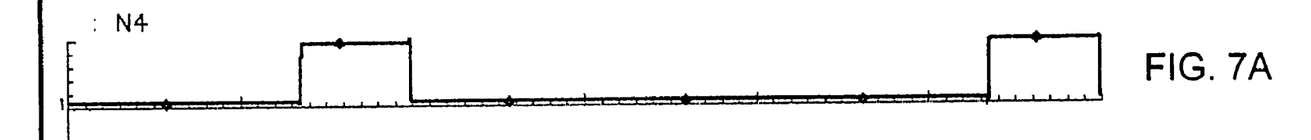
FIGS. 7A, 7B, 7C, 7D, 7E and 7F are plots showing exemplary relationships among signals of the counter shown in FIG. 5, in accordance with an embodiment of the present invention.
Figure 7B:
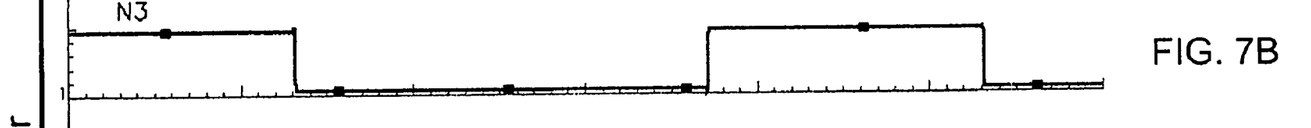
Figure 7C:
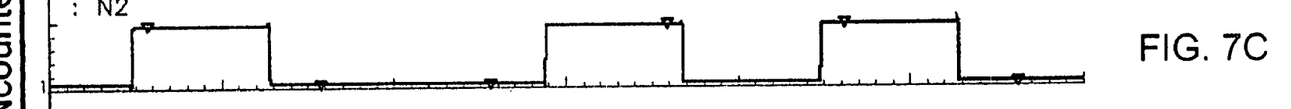
Figure 7D:
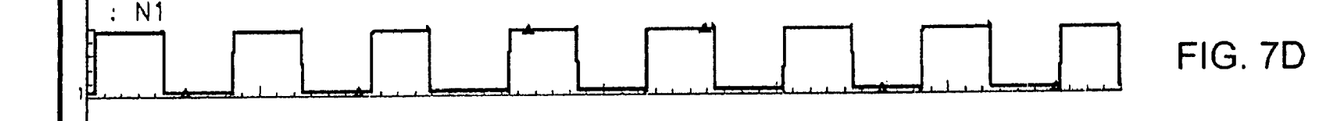
Figure 7E:
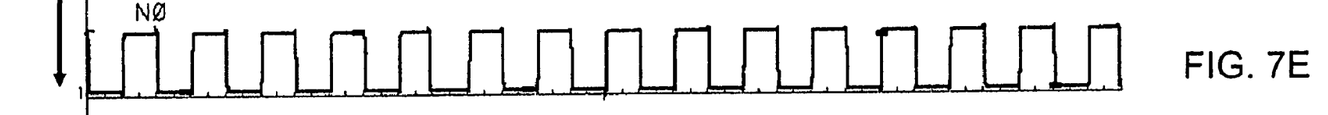
Figure 7F:
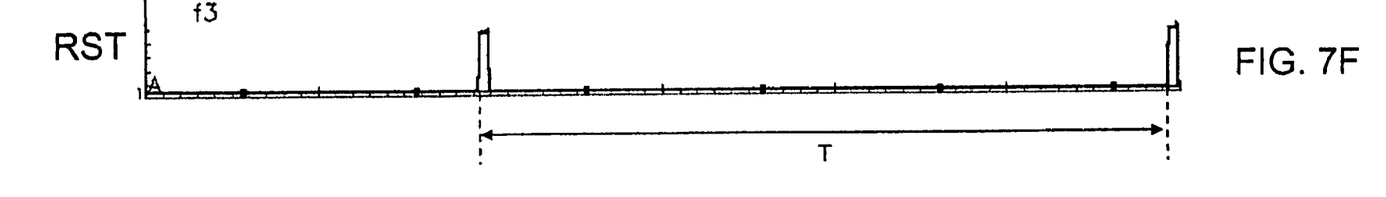

Signal f3 is provided to frequency offset analyzer 210, as shown in FIG. 5. Frequency offset analyzer 210 may be implemented in hardware, or may be implemented as an embedded software routine executed in a microcontroller, or may be a combination of both. Frequency offset analyzer 210 includes rising edge is detector 502, which receives the f3 signal and marks its positive pulse transition. When the f3 signal has a positive pulse transition, rising edge detector 502 toggles the RST (reset) signal. An example of the relationship between the f3 signal and the RST signal is shown in FIGS. 6A and 6B.

Returning to FIG. 5, Ncounter 504 receives the RST signal and an Nclk signal. The RST signal is used to reset Ncounter 504, while the Nclk signal may be a system clock. As shown in FIGS. 7A-7F, Ncounter 504 counts the number of Nclk transitions between the rising edges of the RST signal, and outputs a counter value of Ncnt. Because the RST signal corresponds to the rising edges of the f3 signal, the value of Ncnt is effectively a measure of the period of the f3 signal.

As previously described, the period of the f3 signal is proportional to the difference between the reference frequency f1 and the VCO feedback frequency f2, according to the equation $T=1/(f1-f2)$. The closer that frequencies f1 and f2 are to each other, the longer is the time period T of the f3 signal. Since the relationship between the time period of the f3 signal and the error between the f1 and f2 frequencies are inversely related to each other, PFD 102 is effective in providing a very accurate determination of when the PLL is locked onto the desired frequency.

The Ncnt value is compared to a predetermined threshold count value of Nthreshold by comparator 506. If the Ncnt value exceeds the Nthreshold value, comparator 506 provides a CMP output signal to XOR 507 and toggle logic 508. If control signal LOCK DETECT is in a low state and the CMP output becomes high, then LOCK DETECT is toggled into a high state, indicating that the PLL is locked on correctly to the desired frequency. If, on the other hand, control signal LOCK DETECT is in a high state and the CMP output becomes high, then LOCK DETECT is maintained in its high state, indicating that the PLL is still locked on correctly to the desired frequency. If, however, control signal LOCK DETECT is in a high state and the CMP output becomes low, then LOCK DETECT is toggled into a low state, indicating that the PLL has lost lock to the desired frequency.

Figure 8:
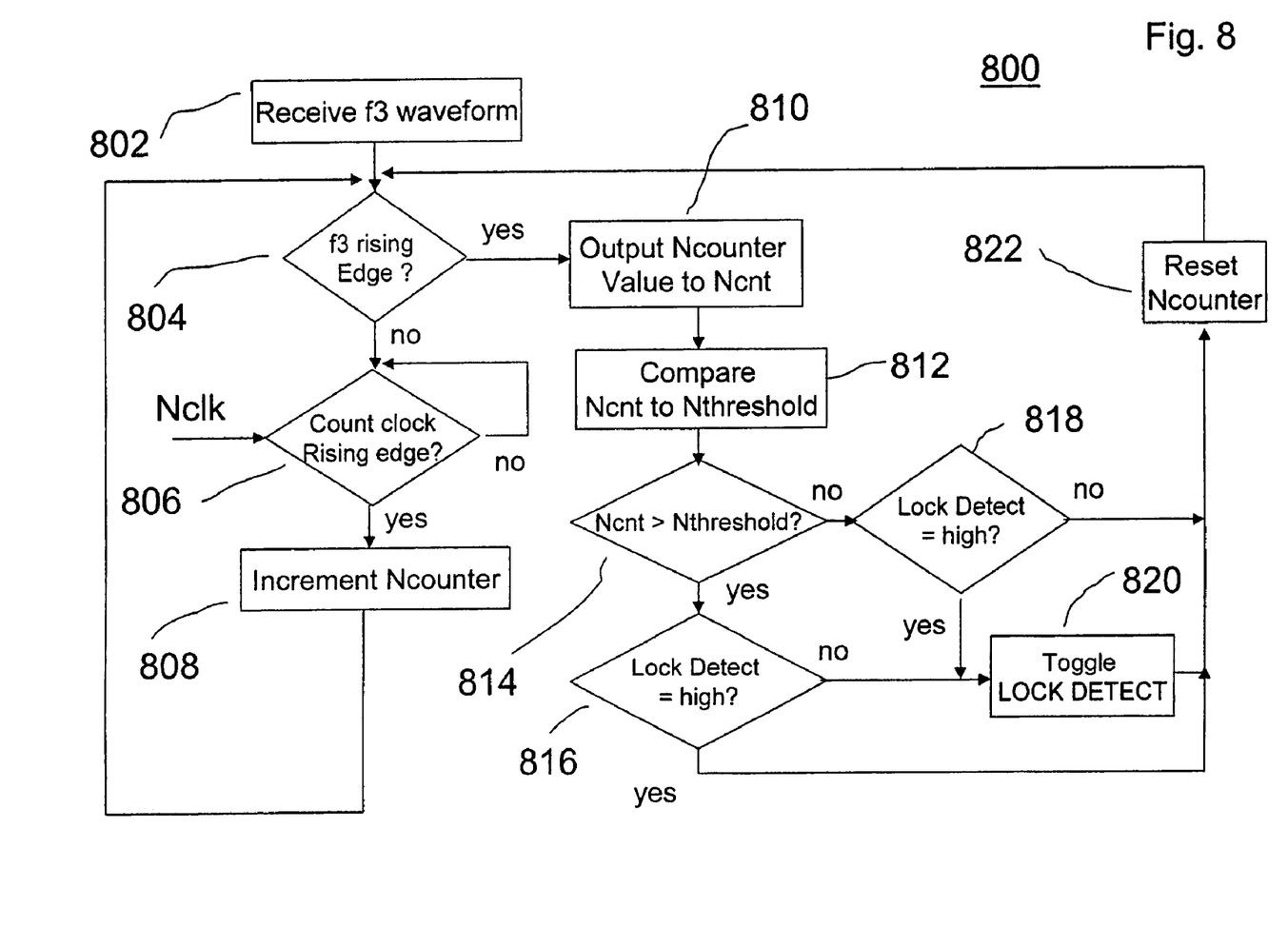
FIG. 8 is a flow diagram showing an exemplary method for determining lock as implemented in the frequency offset analyzer shown in FIG. 5, in accordance with an embodiment of the present invention.

FIG. 8 shows an exemplary method 800 for controlling the LOCK DETECT signal provided from the frequency offset analyzer of FIG. 5. As shown by process block 802, rising edge detector 502 receives the f3 signal (waveform), and waits for a rising edge to be detected on the f3 signal. Decision block 804 remains false until a rising edge is detected. So long as decision block 804 is false, the method sequentially enters decision blocks 806 and 808. During this cycle (804, 806 and 808), Ncounter 504 is incremented one count for every clock cycle of Nclk, thus counting the number of Nclk values between a previous rising edge of the f3 waveform until detection of a current rising edge of the f3 waveform by decision block 804.

When decision block 804 is true, the method moves to process block 810 and outputs the value of Ncounter 504 as the Ncnt value. The value of Ncnt is compared to a predetermined number, Nthreshold, in process block 812 and decision block 814. The number Nthreshold, as previously described, represents the minimum number of Nclk cycles between f3 rising edges for PLL 100 to be considered to have a locked status. Nthreshold is selected to meet a predetermined ppm tolerance level for the frequency accuracy of PLL 100.

Thus, if Ncnt exceeds Nthreshold, decision block 814 becomes true, and PLL 100 is in a locked status. If PLL 100 is in a locked status, the LOCK DETECT output is set high (assuming that it is not already set high) by way of decision block 816 and process block 820. If, however, the LOCK DETECT signal is already high (as determined by decision block 818), then the method does not reset the LOCK DETECT signal and only loops back to reset the Ncounter by way of process block 822.

If Ncnt is less than Nthreshold, however, as determined by decision block 814, the method loops to decision block 818 to determine whether the LOCK DETECT signal is high. If the LOCK DETECT signal is high, then the method enters process block 820 to toggle the LOCK DETECT signal to false. The method loops back to reset the Ncounter by way of process block 822. Process block 822 resets the value of the Ncounter to zero, and the method returns to decision block 804 to detect the next rising edge of the f3 waveform.

Figure 9A:
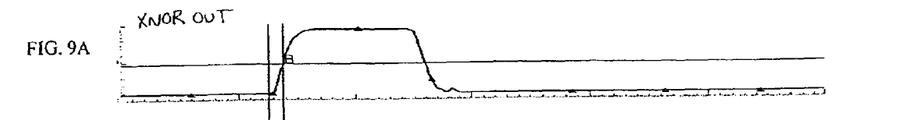
FIGS. 9A, 9B and 9C are timing diagrams showing expanded views of portions of the timings shown in FIGS. 4C, 4D and 4E.
Figure 9B:
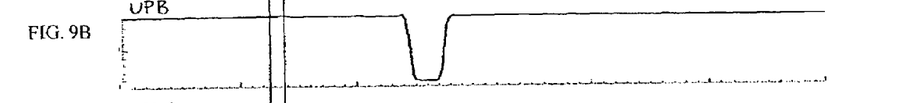
Figure 9C:
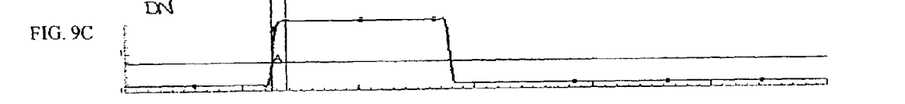

FIGS. 9A-9C show exemplary relationships among UPB, DN and XNOR OUT, when reference frequency f1 is less than VCO feedback frequency f2. As described above, when f1 is less than f2, the UPB pulse is a transient and the DN pulse is proportional to the phase/frequency difference between the f1 and f2 signals.

Figure 10A:
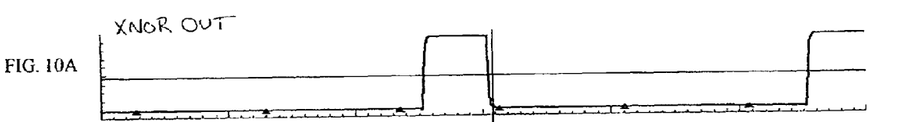
FIGS. 10A, 10B and 10C are more timing diagrams showing expanded views of portions of the timings shown in FIGS. 4C, 4D and 4E.
Figure 10B:
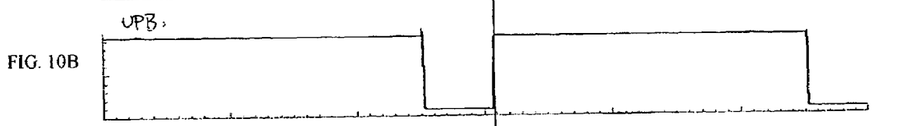
Figure 10C:
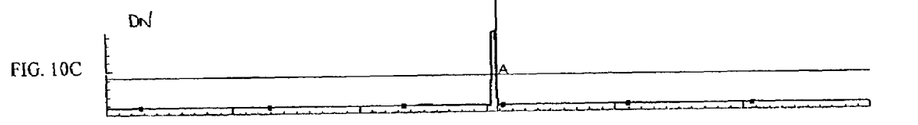

FIGS. 10A-10C show other exemplary relationships among UPB, DN and XNOR OUT, when reference frequency f1 is greater than VCO feedback frequency f2. As described above, when f1 is greater than f2, the DN pulse is a transient and the UPB pulse is proportional to the phase/frequency difference between the f1 and f2 signals.

In operation, PLL 100 has two modes, an acquisition mode and a tracking mode. In the acquisition mode, charge pump 104 is enabled by the Enable1 signal. The Enable1 signal may be a control signal from an external circuit, such as a microcontroller. Similarly, in the tracking mode, the charge pump of PFDCP 110 is enabled by the Enable2 signal. The Enable2 signal may be another control signal from an external circuit, such as a microcontroller. The decision whether to assert the Enable1 signal or the Enable2 signal is based upon the status of the LOCK DETECT output from PFD with High Precision Lock Detector 102. It will be appreciated that the Enable1 and Enable2 signals are mutually exclusive because they cannot be asserted at the same time.

By way of example, tuning voltage V11 that controls VCO 108 has a high gain, such as 1 GHz/Volt, and tuning voltage VT2 has a lower gain, such as 300 MHz/Volt. In the acquisition mode, when the VCO frequency and the desired lock frequency are far apart, it is desired to adjust the VCO frequency quickly. Therefore, the present invention uses charge pump 104 to primarily control the high gain of tuning voltage VT1, and to secondarily control the lower gain of tuning voltage VT2. On the other hand, when the PLL is correctly locked onto the desired frequency, the charge pump of PFDCP 110 is used to primarily fine tune the VCO by way of the low gain of tuning voltage VT2 and tuning voltage VT1 has minimal impact on the frequency of the VCO. This advantageously minimizes the noise of the VCO output signal.

The present invention controls the affect of tuning voltages V11 and VT2 on the VCO by way of filter network 106. The filter network is comprised of three resistors and two capacitors. The combination of R1 and C1 approximately defines the bandwidth of PLL 100 when charge pump 104 is enabled in the acquisition mode. Resistor R2 transfers the voltage between VT1 to VT2. The combination of R3 and C2 approximately defines the bandwidth of PLL 100 when the charge pump of PFDCP 110 is operational in the tracking mode. When V12 is active, little current is passed through R2 and R1 to have any appreciable affect on VT1. In this manner, V11 is effective in supplying a DC bias to the VCO and small frequency shift occurs when VT2 is enabled and VT1 is disabled. In addition, the extra filtering of VT2 by filter network 106 helps dampen the response of VCO 108 and reduces frequency overshoot.

Exemplary values for the elements of filter network 106 may be as follows: the R1, R2 and R3 values may, respectively, be 20K, 10K and 4K; the C1 and C2 values may each be 20 pfd.

The present invention has another advantage over the prior art. Because PFD with High Precision Lock Detector 102 operates at low input frequencies of f1 and f2 (such as in the range of 150 MHz), charge pump 104 does not need to have a high response speed, and may be implemented by an inexpensive charge pump.

As previously described, tuning voltage VT1 has a high gain, such as 1 GHz/Volt, and tuning voltage VT2 has a lower gain, such as 300 MHz/Volt. In the tracking mode, when the VCO frequency and the desired lock frequency are close is together, it is desired to adjust the VCO frequency slowly and avoid any response overshoot. Therefore, it is desired that PFDCP 110 directly control the lower gain tuning voltage VT2, but indirectly maintain the DC voltage level of the high gain tuning voltage VT1. This operation further reduces PLL noise.

Additionally, because PFDCP 110 operates at the higher frequencies of f4 and f5, which in the present embodiment are in the range of 10 GHz, PFDCP 110 needs to have high response speed and, as such, may be implemented by a high frequency Hodge linear PFD and charge pump.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A phase lock loop (PLL) comprising
a voltage controlled oscillator (VCO) for providing a VCO output signal, based on first and second voltage tuning signals inputted to the VCO,
a filter network for outputting the first and second voltage tuning signals to the VCO,
a first phase/frequency detector (PFD) for inputting a first signal to the filter network for forming the first and second voltage tuning signals,
a second phase/frequency detector (PFD) for inputting a second signal to the filter network for forming the first and second voltage tuning signals,
wherein the first and second voltage tuning signals provide, respectively, first and second gains of frequency per volt for controlling a frequency of the VCO output signal, and
when the first PFD is active, the filter network (a) receives the first signal from the first PFD, and responsively outputs the first voltage tuning signal to the VCO and (b) outputs a DC voltage as the second voltage tuning signal to the VCO, and
when the second PFD is active, the filter network (a) receives the second signal from the second PFD, and responsively outputs the second voltage tuning signal to the VCO and (b) outputs another DC voltage as the first voltage tuning signal to the VCO.

2. The PLL of claim 1 wherein the first voltage tuning signal has a higher gain than the second voltage tuning signal, and
the first voltage tuning signal provides coarse frequency control of the VCO output signal and the second voltage tuning signal provides fine frequency control of the VCO output signal.

3. The PLL of claim 1 wherein
the first gain of the first voltage tuning signal is greater than 1 GHz per volt and the second gain of the second voltage tuning signal is less than 500 MHz per volt.

4. The PLL of claim 1 wherein
the filter network includes resistive and capacitive elements for damping or reducing overshoot of the second voltage tuning signal.

5. The PLL of claim 1 including
a first charge pump coupled between the first PFD and the filter network for providing the first voltage tuning signal,
a second charge pump coupled between the second PFD and the filter network for providing the second voltage tuning signal, and
an enable/disable signal for enabling one of the first and second charge pumps or disabling the other one of the first and second charge pumps.

6. The PLL of claim 1 including
a frequency divider coupled to the VCO output signal,
wherein the frequency divider provides a first feedback signal to the first PFD for comparison with a first reference signal, and
a second feedback signal is provided from the VCO output signal to the second PFD for comparison with a second reference signal.

7. The PLL of claim 6 wherein
the first reference signal has a lower frequency than the second reference signal, and
the second reference signal is substantially equal to a desired frequency of the VCO output signal.

8. The PLL of claim 1 including
a frequency offset analyzer coupled to the first PFD for determining frequency lock status of the VCO output signal.

9. The PLL of claim 8 wherein
the frequency offset analyzer includes a counter for determining a period of time, T, based on the following relationship:

$$T=1/(\text{reference frequency}-\text{VCO feedback frequency})$$

where the reference frequency is the frequency of a first reference signal, and the VCO feedback frequency is the frequency of the VCO output signal; and
when T exceeds a predetermined threshold value, the frequency lock status is determined to be correctly locked.

10. The PLL of claim 1 wherein
the DC voltages provided as the first and second voltage tuning signals to the VCO each includes an average voltage.

11. The PLL of claim 1 wherein the first and second voltage tuning signals are correlated to each other.

12. The PLL of claim 1 wherein
the filter network includes a first resistor in series with a first capacitor, one end of the first resistor connected to a first terminal providing the first voltage tuning signal, and
a second resistor in series with the first capacitor, one end of the second resistor connected to a second terminal providing the second voltage tuning signal, when the first PFD is active, the first resistor in series with the first capacitor is configured as an integrator for providing the DC voltage as the second voltage tuning signal to the VCO, and when the second PFD is active, the second resistor in series with the first capacitor is configured as an integrator for providing the other DC voltage as the first voltage tuning signal to the VCO.

13. A phase lock loop (PLL) comprising a voltage controlled oscillator (VCO) for providing a VCO output signal, a phase/frequency detector (PFD) for receiving (a) the VCO output signal and (b) a reference signal, and outputting up/down pulses, a gate for logically combining the up/down pulses and outputting an XOR or XNOR signal, an integrator coupled to the gate for outputting an integrated XOR or XNOR signal, and a comparator for comparing the integrated XOR or XNOR signal to a predetermined threshold level and providing a comparator output signal having a time period dependent upon the integrated XOR or XNOR signal, wherein when the time period of the comparator output signal exceeds a predetermined threshold time period, the VCO is providing a desired frequency for the VCO output signal.

14. The PLL of claim 13 including an edge detector coupled to the comparator for detecting rising edges of the comparator output signal, and a counter coupled to the edge detector for counting a time period between detected rising edges to determine the time period of the comparator output signal.

15. The PLL of claim 14 wherein the counter determines the time period, T, based on the following relationship:

$$T = 1/(\text{reference frequency} - \text{VCO feedback frequency})$$

where the reference frequency is the frequency of the reference signal, and the VCO feedback frequency is the frequency of the VCO output signal; and when T exceeds the predetermined threshold time period, the VCO is providing the desired frequency for the VCO output signal.

16. The PLL of claim 13 including a charge pump coupled between the PFD and the VCO for providing a first voltage tuning signal to control the frequency of the VCO output signal.

17. The PLL of claim 16 including another charge pump coupled between another PFD and the VCO for providing a second voltage tuning signal to control the frequency of the VCO output signal, wherein the second voltage tuning signal has a gain of frequency per volt that is lower than a gain of frequency per volt of the first voltage tuning signal.

18. A method of controlling a frequency of a voltage controlled oscillator (VCO) having an acquisition mode and a tracking mode, the method comprising the steps of:

(a) tuning the frequency of the VCO, by way of a filter network, using a first phase/frequency detector (PFD);

(b) tuning the frequency of the VCO, by way of the filter network, using a second phase/frequency detector (PFD);

(c) enabling the first PFD and disabling the second PFD during the acquisition mode; and (d) enabling the second PFD and disabling the first PFD during the tracking mode, wherein when the first PFD is enabled, the filter network (a) receives a first signal from the first PFD, and responsively outputs a first voltage tuning signal to the VCO and (b) outputs a DC voltage as a second voltage tuning signal to the VCO, and when the second PFD is enabled, the filter network (a) receives a second signal from the second PFD, and responsively outputs the second voltage tuning signal to the VCO and (b) outputs another DC voltage as the first voltage tuning signal to the VCO.

19. The method of claim 18 wherein step (a) includes tuning the frequency of the VCO based on (i) a feedback signal f2 derived from the VCO and (ii) a first reference signal f1; and step (b) includes tuning the frequency of the VCO based on (i) a feedback signal f4 derived from the VCO and (ii) a second reference signal f5;

wherein f1 is approximately equal to f2 and f4 is approximately equal to f5.

20. The method of claim 19 wherein f1 is substantially lower in frequency than f5.

21. The method of claim 19 wherein a VCO output signal has an output frequency of f4.

22. The method of claim 19 including the steps of:

(e) generating a difference signal based on signals f1 and f2;

(f) comparing the difference signal to a threshold value and outputting a signal f3 based on the comparison;

(g) measuring a period T of the outputted signal f3; and (h) determining status of the VCO based on the period T measured in step (g).

* * * * *